US012791598B2

(12) United States Patent
Pandurangan et al.

(10) Patent No.: US 12,791,598 B2
(45) Date of Patent: Nov. 10, 2026

(54) SYSTEMS AND METHODS OF IDENTIFYING ERRORS IN RF CABLING USING SYSTEM LEVEL DISTANCE TO FAULT TEST

(71) Applicant: ECSite, Inc., Santa Clara, CA (US)

(72) Inventors: Anand Pandurangan, San Jose, CA (US); Subramanian Meiyappan, San Jose, CA (US)

(73) Assignee: ECSite, Inc., Santa Clara, CA (US)

( * ) Notice: Subject to any disclaimer, the term of this patent is extended or adjusted under 35 U.S.C. 154(b) by 391 days.

(21) Appl. No.: 18/613,205

(22) Filed: Mar. 22, 2024

(65) Prior Publication Data

US 2024/0319254 A1 Sep. 26, 2024

Related U.S. Application Data

(60) Provisional application No. 63/453,944, filed on Mar. 22, 2023.

(51) Int. Cl.
*G01R 31/08* (2020.01)
*G01R 31/11* (2006.01)

(52) U.S. Cl.
CPC ............ *G01R 31/088* (2013.01); *G01R 31/11* (2013.01)

(58) Field of Classification Search
None
See application file for complete search history.

(56) References Cited

U.S. PATENT DOCUMENTS

| | | | | |
|---|---|---|---|---|
| 11,621,884 | B2 * | 4/2023 | Chappell | G01R 31/08<br>370/242 |
| 2010/0312506 | A1 * | 12/2010 | Taylor | G01R 31/2822<br>702/85 |
| 2017/0034507 | A1 * | 2/2017 | Harris | H04B 3/46 |
| 2023/0216098 | A1 * | 7/2023 | Sandoval | G01R 31/54<br>324/426 |
| 2026/0092962 | A1 * | 4/2026 | Gundel | G01R 31/085 |

* cited by examiner

*Primary Examiner* — Raymond L Nimox
(74) *Attorney, Agent, or Firm* — Dority & Manning, P.A.

(57) ABSTRACT

Systems and methods of identifying errors in RF cabling using system level distance to fault. A method of determining system level RF health in an RF deployment, the method including predicting an RF health of the deployment based on a known attribute of the deployment; receiving a distance to fault (DTF) measurement from the deployment, wherein receiving the DTF measurement includes: transmitting a test signal into a cable associated with the RF deployment; and receiving a return signal from the cable, the return signal including a reflection; comparing the predicted RF health to the received DTF measurement; and identifying mismatches between the predicted RF health and the received DTF measurement based on the comparing.

20 Claims, 4 Drawing Sheets

SYSTEMS AND METHODS OF IDENTIFYING ERRORS IN RF CABLING USING SYSTEM LEVEL DISTANCE TO FAULT TEST

CROSS-REFERENCE TO RELATED APPLICATIONS

The present application claims priority to U.S. Provisional Patent Application No. 63/453,944 filed on Mar. 22, 2023, the disclosure of which is incorporated by reference herein in its entirety.

FIELD

The present disclosure relates generally to telecommunication systems, and more particularly, to systems and methods of identifying errors in RF cabling using system level distance to fault.

BACKGROUND

Telecommunication systems employ interconnected webs of cables coupled together and to telecommunication equipment. Telecommunication systems can stretch hundreds of miles and include dozens (if not hundreds) of telecommunication equipment components.

One type of telecommunication system is a Distributed Antenna System (DAS). DAS are used in deployments of cellular, WiFi, and public safety radio infrastructure. DAS are particularly useful in large buildings (malls, schools, high-rise buildings, airports, etc.), and in large enterprise deployments. However, once installed, these systems are difficult to analyze and identify errors within. In particular, cables associated with the DAS may run within walls and support structures, limiting access to the cables and components coupled therewith. As a result, errors occurring within the DAS (and telecommunication systems at large) are frequently difficult to isolate and the location of said errors is often impossible to determine.

Accordingly, improved systems and methods of detecting and identifying errors in such cabling are desired in the art.

BRIEF DESCRIPTION

Aspects and advantages of the invention in accordance with the present disclosure will be set forth in part in the following description, or may be obvious from the description, or may be learned through practice of the technology.

In accordance with one embodiment, a method of determining system level RF health in an RF deployment is provided. The method includes predicting an RF health of the deployment based on a known attribute of the deployment; receiving a distance to fault (DTF) measurement from the deployment, wherein receiving the DTF measurement comprises: transmitting a test signal into a cable associated with the RF deployment; and receiving a return signal from the cable, the return signal including a reflection; comparing the predicted RF health to the received DTF measurement; and identifying mismatches between the predicted RF health and the received DTF measurement based on the comparing.

In accordance with another embodiment, test equipment configured to determine system level health in an RF deployment is provided. The test equipment includes one or more processors; a memory in communication with the one or more processors, the memory storing computer-executable instructions which, when performed by the one or more processors, cause performance of a method, the method comprising: predicting an RF health of the RF deployment based on a known attribute of the RF deployment; receiving a distance to fault (DTF) measurement from the deployment, wherein receiving the DTF measurement comprises: transmitting a test signal into a cable associated with the RF deployment; and receiving a return signal from the cable, the return signal including a reflection; comparing the predicted RF health to the received DTF measurement; and identifying mismatches between the predicted RF health and the received DTF measurement based on the comparing.

In accordance with another embodiment, a non-transitory computer readable medium having instructions which, when executed by a processor of a test equipment, cause the processor to perform operations is provided. The operations include predicting an RF health of the RF deployment based on a known attribute of the RF deployment; receiving a distance to fault (DTF) measurement from the deployment, wherein receiving the DTF measurement comprises: transmitting a test signal into a cable associated with the RF deployment; and receiving a return signal from the cable, the return signal including a reflection; comparing the predicted RF health to the received DTF measurement; and identifying mismatches between the predicted RF health and the received DTF measurement based on the comparing.

These and other features, aspects and advantages of the present invention will become better understood with reference to the following description and appended claims. The accompanying drawings, which are incorporated in and constitute a part of this specification, illustrate embodiments of the technology and, together with the description, serve to explain the principles of the technology.

BRIEF DESCRIPTION OF THE DRAWINGS

A full and enabling disclosure of the present invention, including the best mode of making and using the present systems and methods, directed to one of ordinary skill in the art, is set forth in the specification, which makes reference to the appended figures, in which.

DETAILED DESCRIPTION

Figure 1:
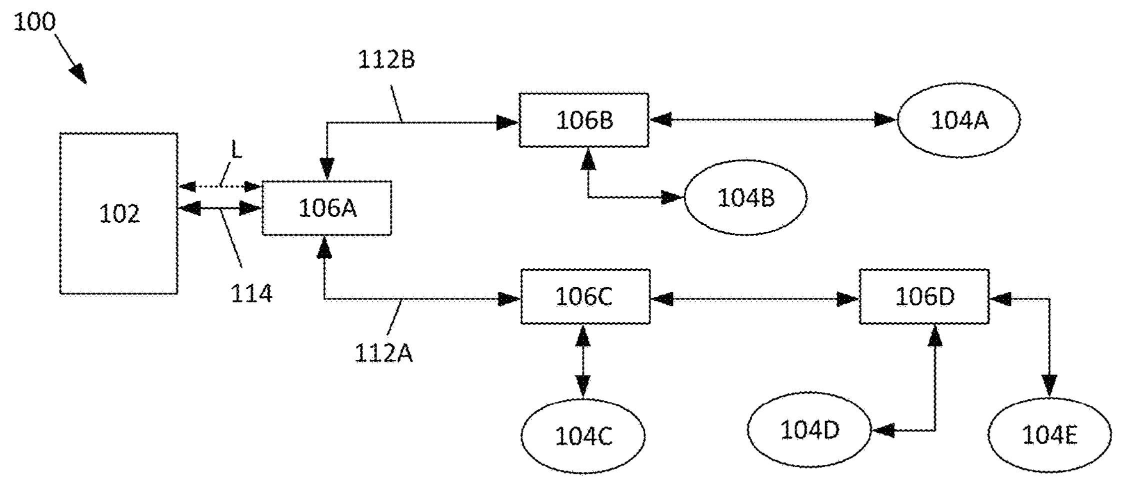
FIG. 1 is a schematic of a deployment in a telecommunication system in accordance with embodiments of the present disclosure.

Reference now will be made in detail to embodiments of the present invention, one or more examples of which are illustrated in the drawings. The word "exemplary" is used herein to mean "serving as an example, instance, or illustration." Any implementation described herein as "exemplary" is not necessarily to be construed as preferred or advantageous over other implementations. Moreover, each example is provided by way of explanation, rather than limitation of, the technology. In fact, it will be apparent to those skilled in the art that modifications and variations can be made in the present technology without departing from the scope or spirit of the claimed technology. For instance, features illustrated or described as part of one embodiment can be used with another embodiment to yield a still further embodiment. Thus, it is intended that the present disclosure covers such modifications and variations as come within the scope of the appended claims and their equivalents. The detailed description uses numerical and letter designations to refer to features in the drawings. Like or similar designations in the drawings and description have been used to refer to like or similar parts of the invention.

As used herein, the terms "first", "second", and "third" may be used interchangeably to distinguish one component from another and are not intended to signify location or importance of the individual components. The singular forms "a," "an," and "the" include plural references unless the context clearly dictates otherwise. The terms "coupled," "fixed," "attached to," and the like refer to both direct coupling, fixing, or attaching, as well as indirect coupling, fixing, or attaching through one or more intermediate components or features, unless otherwise specified herein. As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Terms of approximation, such as "about," "generally," "approximately," or "substantially," include values within ten percent greater or less than the stated value. When used in the context of an angle or direction, such terms include within ten degrees greater or less than the stated angle or direction. For example, "generally vertical" includes directions within ten degrees of vertical in any direction, e.g., clockwise or counter-clockwise.

Benefits, other advantages, and solutions to problems are described below with regard to specific embodiments. However, the benefits, advantages, solutions to problems, and any feature(s) that may cause any benefit, advantage, or solution to occur or become more pronounced are not to be construed as a critical, required, or essential feature of any or all the claims.

In general, systems and methods described herein are employed for detecting issues associated with transmissibility of signals in radio frequency (RF) cabling. In particular, systems and methods described herein allow for quick and precise determination of system level RF health in a telecommunication deployment. The determined system level health can be used to validate the deployment prior to going live (i.e., prior to user's interacting with the deployment) and/or to troubleshoot issues arising after the deployment is live. Example troubleshooting may include unexpected signal loss, weaker-than-expected signal power, or the like.

In some implementations, the determined system level health, and more particularly data associated with the determined system level health, can be used to inform future operational processing. For example, RF signatures associated with various RF components can be detected as part of a system level health analysis. The RF signatures can be processed, for example using a machine learning computing system, and resulting data can be stored (e.g., in a database) for future reference. Relying on the stored data, future validation and servicing operations can more quickly assess system level health to provide insight for correction and servicing.

Systems and methods described herein allow technicians (both during installation and servicing) to quickly and easily detect system level health without having to serially test individual cables and components as frequently practiced using traditional techniques and systems. System level health may refer to the health of an entire deployment (or at least a multi-component portion of the deployment). That is, system level health can include an analysis of an entire deployment such that the technician is not required to move around the deployment to capture information associated with individual segments/components of the deployment. This is significantly more time and cost effective as compared to traditional techniques which rely on individual testing of each cable and component to validate and troubleshoot.

Referring now to the drawings, FIG. 1 illustrates an example Distributed Antenna System (DAS) deployment 100. DAS deployments 100 typically utilize a single radio frequency (RF) radio (transmit (Tx)/receive (Rx)) system that is coupled to a plurality of antennas (e.g., antenna 104A, 104B, 104C, 104D, 104E, . . . 104N) (collectively referred to hereinafter as antennas 104) through a plurality of radio frequency (RF) components (e.g., RF component 106A, 106B, 106C, 106D, . . . 106N) (collectively referred to hereinafter as RF components 106). The RF components 106 depicted in FIG. 1 may all be splitters, and more particularly unequal splitters (also known as tappers). RF signals transmitted through the tappers may branch into unequal ratios. Yet other types of RF components 106 may be used in the deployment 100, such as, for example, hybrid couplers, combiners, and the like. These and other RF components 106 operate in concert (e.g., together) to transmit power through the deployment 100 as required by the particular application. RF signals are defined over a wide range of radio frequencies, ranging between several hundred megahertz (MHz) and several gigahertz (GHz).

The RF components 106, and more particularly the splitters, can split the power in specific ratios between two or more output ports in the Tx (transmit) direction. In the Rx (receive) direction, the RF components 106, and more particularly the splitters, can split the received power and/or route all of the power to a source port. The relative splitting ratio of power may be determined depending on the design of the splitter and/or the specific characteristics and requirements associated with the deployment 100. It is typical for deployments 100 to utilize anywhere between 10 and 200 antennas, and more particularly between 20 and 100 antennas, in addition to several radios and splitters all distributed throughout the deployment 100.

Figure 2:
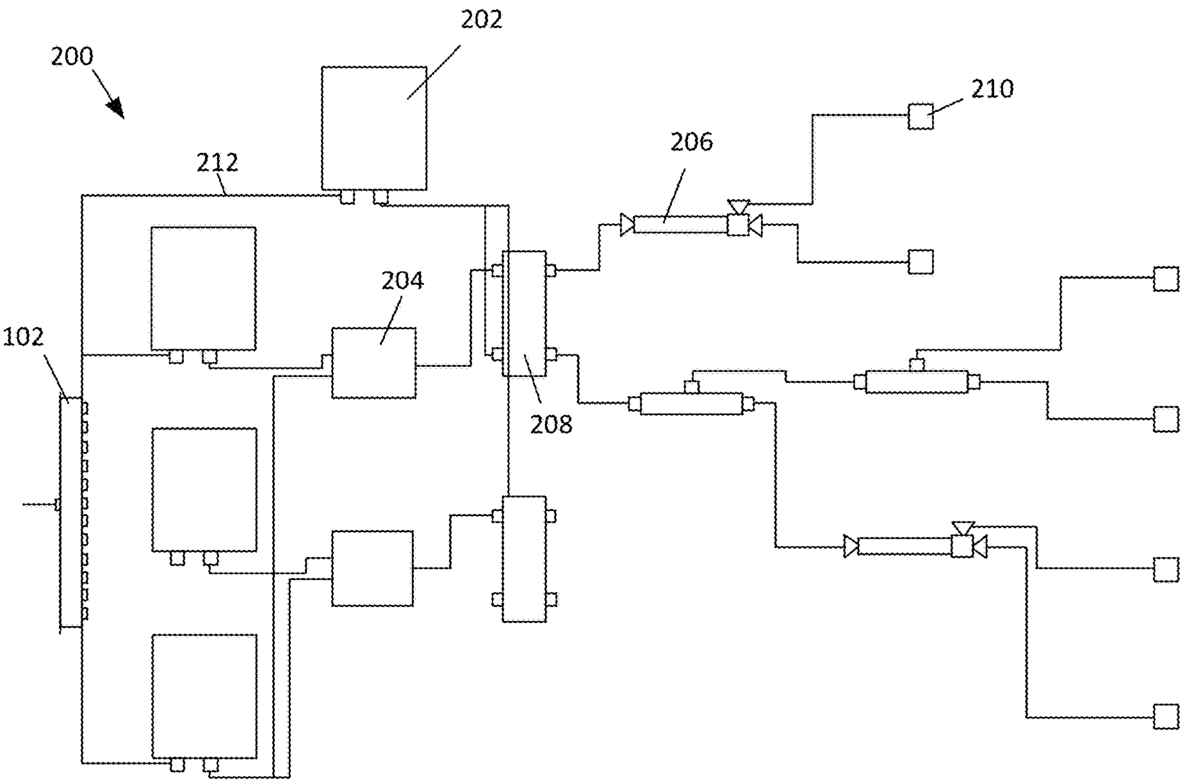
FIG. 2 is a schematic of a deployment in a telecommunication system in accordance with embodiments of the present disclosure.
Figure 3:
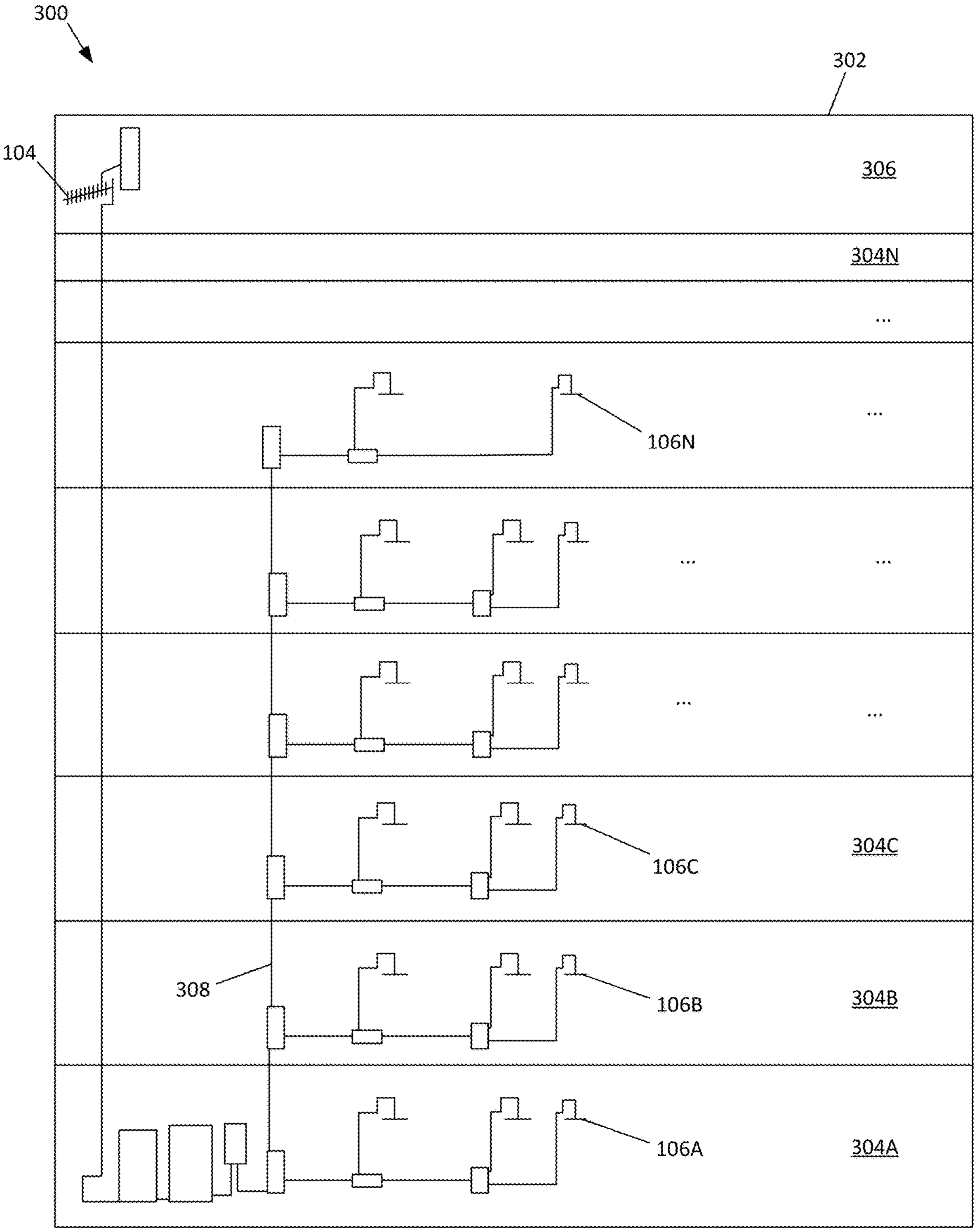
FIG. 3 is a schematic of a deployment in a telecommunication system in accordance with embodiments of the present disclosure.

FIGS. 2 and 3 illustrate further example deployments 200, 300. The deployment 200 depicted in FIG. 2 is a hybrid deployment including a plurality of multiple input multiple output (MIMO) devices 202, diplexers 204, tappers 206, hybrid couplers 208, and antennas 210. A plurality of cables 212 interconnect the various components of the deployment 200 to allow for transmission of RF signals throughout the deployment 200.

The deployment 300 depicted in FIG. 3 is part of a multistory building 302 including a plurality of floors 304A, 304B, 304C, . . . 304N (collectively referred to hereinafter as floors 304) stacked on top of one another. At least some of the plurality of floors 304 include RF components 106 and an antenna 104 is disposed at (or near) a roof 306 of the multistory building 302. The RF components 106 may be coupled together and with the antenna 104 through cables 308. The cables 308 can extend through walls, flooring, and other conduits passing through the building 302 to interconnect the RF components 106 and the antenna 104. Example RF components 106 includes MIMO devices, diplexers, tappers, couplers, and the like. These and other components can operate in concert (i.e., together) to provide radio signal broadcasts where necessary for user interaction.

Deployments 100, 200, 300 like those depicted in FIGS. 1 to 3 are typically installed during erection of a building by construction technicians that are not trained in radio frequency (RF) principles. As a result, the deployments often include mistakes that affect RF principles. Example mistakes often incurred during installation of deployments, such as deployments 100, 200, 300, include incorrect cable handling, cable length inaccuracies, swapping/mixing cable ports on RF components such as unequal splitters, and the like. Incorrect cable handling may occur, for example, if a cable of the deployment is insufficiently harnessed (retained) in situ or if the cable is bent tightly (with a radius of curvature less than an operational radius of curvature based on the specification of the cable). Such inadequate restraint and/or incurring tight bends within the cable results in a significant amount of radio frequency (RF) power being wasted. The wasted power is lost and cannot be transmitted to the final destination. Loss incurred in the cable may be significant, greatly decreasing the range of signal transmission and degrading signal quality at the receiving end of the cable. As a result, attached RF components may not receive sufficient signal strength to perform their typical functionality. Where ports of RF components are swapped/mixed during installation, the amount of power at one portion of the deployment may be too great whereas power at another portion of the deployment may be too little. For instance, by way of non-limiting example, referring again to FIG. 1, if a first RF component 106A is expected to transmit a first percentage of power (e.g., 70% of the power) to a bottom arm 112A of the deployment 100 and a second percentage of power (e.g., 30% of the power) to an upper arm 112B of the deployment 100, then flipping the ports would cause an incorrect amount of power to be transmitted through the bottom arm 112A and the upper arm 112B. As a result, the antennas 104 (or other components coupled within the bottom and upper arms 112A and 112B of the deployment 100) would receive vastly different amounts of power than anticipated. In some circumstances, this difference in power may compromise the deployment, the RF components, and/or the structures coupled therewith.

Where installation problems associated with the deployment 100, 200, 300 are not detected before the deployment goes live (i.e., prior to transmitting power through the cables of the deployment 100, 200, 300), performance of the deployment 100, 200, 300 may suffer. As a result, the deployment 100, 200, 300 may not operate as intended and one or more systems configured to operate therewith (such as antennas in communication with antenna(s) of the deployment 100, 200, 300, and or other components) may not operate as desired. This may be experienced in the form of poor service coverage, dropped connections, lower data rates, or the like. Upon experiencing these problems, it is likely that users will report outages and connection issues. A service technician is typically dispatched to check the deployment 100, 200, 300. The service technician must take the deployment 100, 200, 300 offline (i.e., disconnect user access) to perform servicing operations, and a substantial investigation into the problem must be carried out.

Since these substantial investigations are both costly and disruptive to users, the deployment 100, 200, 300 may be tested during installation (or more particularly, after installation is mostly or fully completed and the deployment is in place within the environment but still offline). To test the deployment, the installation technician may be expected to run a large number of tests at every node of the deployment 100, 200, 300. For example, the deployment 100 depicted in FIG. 1 includes 9 (nine) cables 114 coupled to 4 (four) RF components 106 and 5 (five) antennas 104. Each of the cables 114 is independently tested by the installation technician. Testing may include insertion loss testing, return loss testing, and distance to fault (DTF) measurement testing.

DTF measurements are performed by transmitting an RF pulse onto a cable from test equipment and capturing reflections that return to (or near) the transmitting location. The captured reflections are analyzed by test equipment (sometimes the same as the test equipment used to transmit the RF pulse into the cable). Using the time difference between the transmission and reception, as well as the velocity of propagation, the distance of the reflection can be estimated. Reflections originate at (are generated by) every impedance mismatch point in the deployment. For example, every connection between a cable and a splitter represents a mismatch point within the deployment. The interface between an antenna and the air (i.e., external environmental position) is another example impedance mismatch point. All mismatches should be minor for optimal system performance (i.e., the strength of reflected signals should be small for optical system performance). However, if a cable is not fastened properly to an RF component or other structure, or the RF component is not working properly, or a cable is bent with a radius of curvature less than an allowable rate, the strength of the reflected signal is stronger.

DTF measurements can be performed using a plurality of different methodologies. For example, DTF measurements can be performed using Time Domain Reflectometry (TDR). TDR is performed in the time domain. A pulse unit is transmitted on a cable. The rising edge of the pulse unit determines the bandwidth and hence the resolution of the reflection. Alternatively, DTF measurement can be performed using Frequency Domain Reflectometry (FDR). FDR is performed by transmitting discrete frequencies one at a time and capturing the reflected signal. This is, in effect, a "return loss" sweep. The magnitude and phase of the reflected signal are captured. An inverse Fourier transform may be performed on the resulting data to transform the signal to the time domain and provide information identical to TDR-type measurements. However, FDR may be better suited to DTF measurements in DAS deployments as FDR provides a greater range of data that may be more representative of system level RF health, described below in greater detail. The tests described above, e.g., insertion loss testing, return loss testing, and DTF measurements, may be performed by connecting test equipment to one end of each cable 114 and connecting a specific RF termination (open, short, or 50-ohm load) to the other end of the cable. After coupling the test equipment and RF termination to the cable 114, the test can be executed. This must be repeated for each cable 114. In the example depicted in FIG. 1, this requires 27 (twenty-seven) total tests for a single frequency band. The tests are often repeated for each frequency band applicable to the deployment. Thus, for 2 (two) frequency bands, the number of total tests would be 54 (fifty-four). For 50 (fifty) frequency bands, the number of total tests would be 1,350 (one thousand three hundred fifty). The number of tests increases rapidly as the number of frequency bands and the number of cables 114 increases. Tests performed by the installation technician ensure that the cables are functional prior to finalizing assembly. After connections are complete, system return loss testing is performed.

The testing outlined above takes a significant amount of time to complete and must be performed by skilled workers who understand and evaluate the test results in situ. Only individual cable segments can be verified using the test protocol outlined above and system interconnect and port swapping on RF components cannot be identified. An improved implementation is desired to reduce test time and operator skill requirements, as well as to allow for detection of port swapping on RF components.

In an embodiment, a method of testing a DAS deployment (such as depicted, e.g., in FIGS. 1 to 3), may include employing a plurality of DTF measurements. The number of measurements can depend on the scale (size) of the system. For the system depicted in FIGS. 1 and 2, only one DTF measurement may be needed. The DTF measurement may need to be performed over a wide band—typically 600 MHz to 4 GHz. The measurement can be performed at a specific point within the deployment. In the case of FIG. 1, the measurement can be performed from the cable 114 coupled to the RX/TX unit 102 (i.e., the leftmost cable 114 depicted in the deployment 100). In FIG. 2, for example, the measurement can be performed at the cable 212 connected to the MIMO device 202. If, however, this location is not readily accessible such that a technician can readily access the cable 212 connected to the MIMO device 202, the method can be performed from a cable 212 coupled to another one of the components. In certain complex systems, there can be a set of measurements and the method can include identifying the points of measurement (i.e., where the measurement was taken from).

Figure 4:
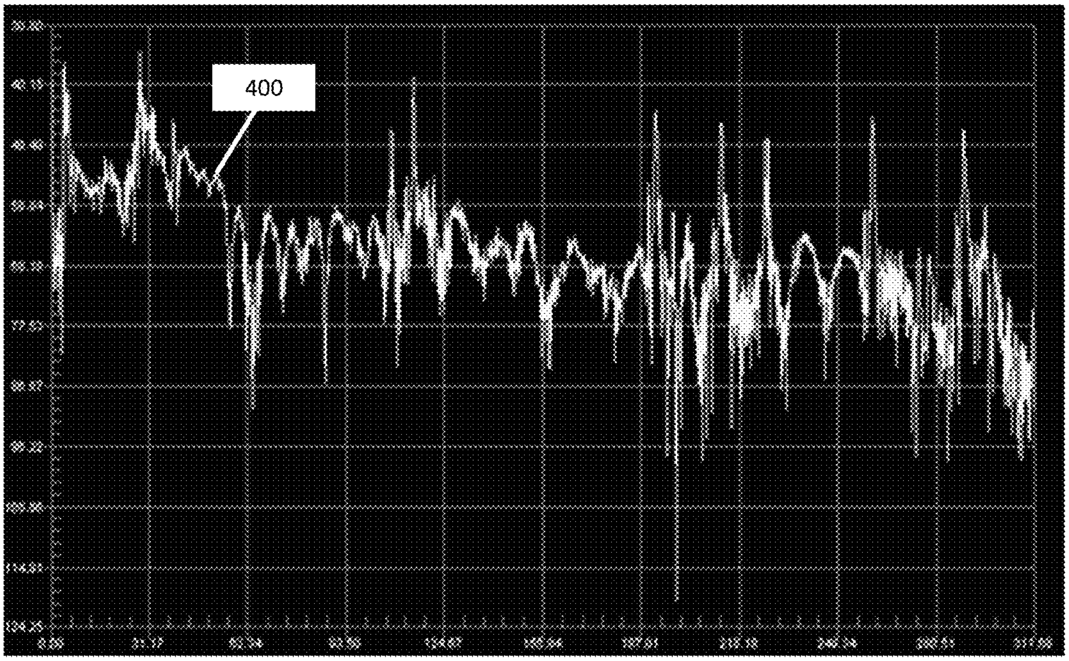
FIG. 4 is a chart of a distance to fault measurement as detected in a deployment in a telecommunication system in accordance with embodiments of the present disclosure.
Figure 5:
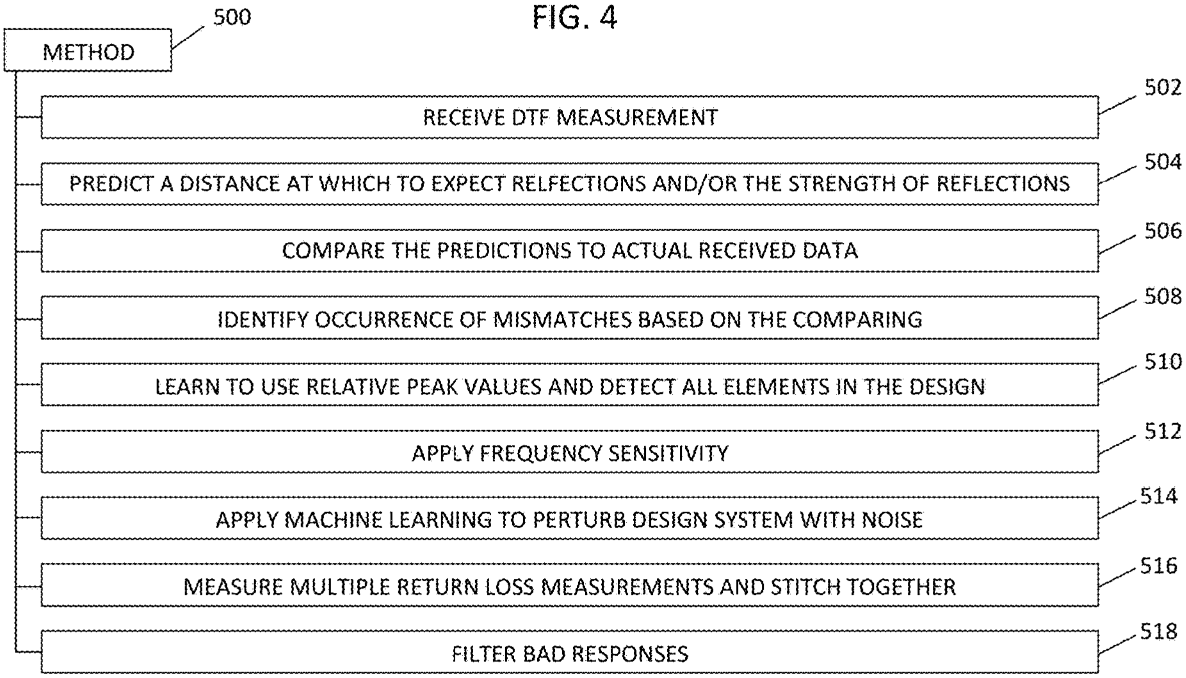
FIG. 5 is a flow chart of a method of analyzing information associated with a distance to fault measurement as detected in a deployment in a telecommunication system in accordance with embodiments of the present disclosure.

In accordance with an example implementation, a DTF measurement 400 for the deployment 200 depicted in FIG. 2 is illustrated in FIG. 4. Referring to FIG. 4, the X-axis represents distance (as measured in feet, although other units are possible) and the Y-axis represents signal strength (as measured in decibels (dB)). Using a single measurement such the DTF measurement 400 depicted in FIG. 4, a method can be employed to identify any failures in the installation of the deployment. An example method 500 is depicted in FIG. 5. In general, the method 500 will be described with reference to a deployment 100, 200, 300 such as depicted in FIGS. 1 to 3 and in view of a DTF measurement, such as the DTF measurement 400 depicted in FIG. 4. In addition, although FIG. 5 depicts steps performed in a particular order for purposes of illustration and discussion, the method 500 discussed herein is not limited to any particular order or arrangement. One skilled in the art, using the disclosure provided herein, will appreciate that various steps of the method disclosed herein can be omitted, rearranged, combined, and/or adapted in various ways without deviating from the scope of the present disclosure. Steps depicted in FIG. 5 are intended to provide example implementations and are not intended as limiting to a particular overall methodology employed herein.

The method 500 can include receiving 502 a DTF measurement, such as the DTF measurement 400 depicted in FIG. 4. The DTF measurement can be captured by testing the system and components/cables associated therewith using methodology as described above. The captured DTF measurement can be received at testing equipment and can undergo any one or more of filtering, noise-delimiting, or the like.

The method 500 can further include predicting 504 distance(s) at which to expect reflection(s) and/or the strength of those reflection(s). Predicting 504 distance and/or strength of the reflections may be performed in view of the deployment and an anticipated DTF measurement. Predicting 502 can be performed by one or more processors 600 (see FIG. 6) using information associated with the deployment. The processor(s) 600 can be any suitable processing device (e.g., a control circuitry, a processor core, a microprocessor, an application specific integrated circuit, a field programmable gate array, a controller, a microcontroller, etc.) and can be one processor or a plurality of processors that are operatively connected. The processor(s) 600 can be coupled to a memory 602. The memory 602 can include one or more non-transitory computer-readable storage media, such as RAM, ROM, EEPROM, EPROM, one or more memory devices, flash memory devices, etc., and combinations thereof. The memory 602 can store information that can be accessed by the processor(s) 600. For instance, the memory 602 (e.g., one or more non-transitory computer-readable storage mediums, memory devices) can include computer-readable instructions 604 that can be executed by the processor(s) 600. The instructions 604 can be software, firmware, or both written in any suitable programming language or can be implemented in firmware or hardware. Additionally, or alternatively, the instructions 604 can be executed in logically and/or virtually separate threads on processor(s) 600. For example, the memory 602 can store instructions 604 that when executed by the processor(s) 600 cause the processor(s) 600 to perform operations such as any of the operations and functions as described herein.

In designing a particular deployment, the layout and architecture of the various cables and RF components is known, both individually and in relation to one another. For example, FIG. 1 may be schematic representation prepared by a designer to satisfy a particular deployment need and layout. The design includes information about the cables 114, the RF components 106, the antennas 104, and the radio system 102. For example, an intended length L of each cable 114 is known. The relative placement of each cable 114 is known. The velocity of propagation within each cable is known. For example, the velocity of propagation (and other technical aspects associated with the cable) may be provided in a datasheet available to the installation/testing technician. Similar information regarding the RF components 106 may also be known. That is, for example, the exact distance to each RF component 106, internal aspects and operating characteristics of each RF component 106, and the like may be known. Collectively, this known information provides a map of the deployment 100 that can be used to predict 504 the distance(s) at which to expect reflection(s) and/or the strength of those reflection(s) (i.e., as a result of the connection of components to form the deployment).

Alternatively, the velocity of propagation of either/both the cables and/or other RF components may be determined experimentally, e.g., using a known methodology. For example, an installation technician can individually test one of the cables 114 to determine the velocity of propagation within the tested cable. The determined velocity of propagation can then be assumed for each of the other cables in the deployment. A database 606 (FIG. 6) can be constructed from known and/or determined data to understand velocity of propagation within the deployment. The database 606 can be compiled over (at) individual testing operations (i.e., at the time of installation) or as a result of comprehensive experimental testing compiled over successive testing operations. The database 606 may be stored, e.g., at memory 604, to be accessed by the processor(s) 600 during application of the method 500.

Predicting 504 the distance(s) and/or strength(s) of reflection(s) can be performed in view of the stored and/or tested velocity of propagation within the deployment. For example, where the deployment architecture (layout) is known, it is possible to determine where reflections are anticipated (i.e., a distance at which to expect reflections) and a strength of the reflections in view of the known data associated with the cables and the RF components. Effectively, predicting 504 may be performed to generate an expected RF system map without relying on actual testing data performed at that particular deployment.

In an embodiment, the method 500 further includes comparing 506 the prediction determined at step 504 to actual data received at step 502. In some instances, predicting 504 can be performed prior to receiving 502 the DTF measurement at step 502. In other instances, predicting 504 can be performed after receiving 502 the DTF measurement. If the implementation of the deployment followed the design perfectly (e.g., each cable is precisely cut at the defined length, each cable is accurately coupled to each RF component, etc.), there would be no difference between the prediction determined at step 504 and the actual data received at step 502. If the implementation is performed with a high degree of precision (but within normal expected human error), the difference between the prediction at step 504 and actual data received at step 502 would be within an acceptable range of tolerance (e.g., 0.1%). If, however, the deployment deviated from the design by a sufficient amount (e.g., one of the cables is 3% longer than anticipated, the peak signal strength of the reflection is 5% higher than anticipated, etc.), the comparison 506 would identify occurrence of a mismatch. Deviation between the prediction and actual data may occur as a result of several factors. For instance, during installation it is common for cable lengths to be modified to fit the actual requirements of the building. By way of non-limiting example, a cable pathway may be made longer or shorter than expected, an unexpected obstacle in the structure of the building or deployment area may require use of additional length of cable to circumvent, manual installation errors can occur during installation, and the like. These and other changes/deviations from the original deployment map (plan) can result in mismatch determined by comparing 506 the prediction to the actual received data.

Identifying the mismatch can occur at step 508 based on the comparing performed at step 506. By way of non-limiting example, a mismatch may be identified 508 when the actual data received at step 502 deviates from the prediction at step 504 by a predefined threshold (tolerance). The predefined threshold tolerance can include an absolute value (e.g., +/−0.5 dB) or a relative ratio (e.g., /−0.5%). The predefined threshold tolerance can be static or adjustable. In some implementations, tighter tolerance may be required. In other implementations, some deviation (mismatch) may be acceptable in view of the cumbersome installation process and/or specific system requirements. In some instances, the technician may be able to switch between different threshold tolerances based on the particular attributes and requirements of the system being installed. Larger systems may require tighter tolerances to prevent outgoing signals from degrading too much from expected power rates while smaller systems may be more forgiving, allowing the technician to set relatively larger tolerances.

As described above, some elements in the deployment, e.g., RF components, may have standardized or known RF signatures. These known RF signatures may relate, for example, to known peak values (dB) that are detectable during testing. For example, reflections seen in the DTF measurement (such as the DTF measurement 400 depicted in FIG. 4) have peak values which may correspond to peak values of known RF signatures. Using these known peak values, the system may be able to determine the presence of certain elements in the design. Thus, in addition to identifying a distance to the element, the type of element generating the reflection may be determinable.

The method 500 can further include a step 510 of learning to use known information, such as relative peak values generated by known RF components, to detect all elements in the design. Referring to FIG. 7, a portion of an example DTF measurement 700 taken at an example deployment including a splitter and antenna is provided. The DTF measurement 700 includes peak values associated with the splitter and antenna. In particular, the splitter has a peak value 702 of approximately 46.9 dB and the antenna has a peak value 704 of approximately 39.0 dB. Where the peak value of an element is known, such as for example, stored in the database 606 (FIG. 6), the system may be able to identify the element in view of the detected peak value. More particularly, the system may be able to determine the type of element from the peak value in the DTF measurement. Thus, for example, the system may be able to identify the splitter by a peak value of 46.9 dB and the antenna by a peak value of 39.0 dB. It should be understood that the exact make and model of the element may alter the peak value as each design exhibits a unique fingerprint (or RF signature) based on its design and operating characteristics. Therefore, learning 510 to use relative peak values can include learning the make and model of each element in view of peak values and storing learned information (e.g., make and model in view of peak value) for future use (e.g., at the database 606 depicted in FIG. 6).

In an embodiment, learning 510 can be performed by a machine learning computing system. According to an aspect of the present disclosure, the machine learning computing system can store or include one or more machine-learned models. As examples, the machine-learned models can be or can otherwise include various machine-learned models such as, for example, neural networks (e.g., deep neural networks), support vector machines, decision trees, ensemble models, k-nearest neighbors models, Bayesian networks, or other types of models including linear models and/or non-linear models. Example neural networks include feed-forward neural networks (e.g., convolutional neural networks, etc.), recurrent neural networks (e.g., long short-term memory recurrent neural networks, etc.), and/or other forms of neural networks.

In some implementations, the machine learning computing system can receive the one or more machine-learned models from a separate (remote) machine learning computing system over one or more networks and can store the one or more machine-learned models in a memory. The machine learning computing system can use or otherwise implement the one or more machine-learned models (e.g., by processor (s)). In particular, the machine learning computing system can implement the machine learned model(s) to generate, analyze, and/or detect peak values associated with elements to be used in RF systems and the like.

The machine learning computing system can include one or more processors and a memory. In an example embodiment, the processor(s) and memory can correspond to the processor(s) 600 and memory 602 described above. The one or more processors can be any suitable processing device (e.g., a processor core, a microprocessor, an ASIC, a FPGA, a controller, a microcontroller, etc.) and can be one processor or a plurality of processors that are operatively connected. The memory can include one or more non-transitory computer-readable storage media, such as RAM, ROM, EEPROM, EPROM, one or more memory devices, flash memory devices, etc., and combinations thereof.

The memory can store information that can be accessed by the one or more processors. For instance, the memory (e.g., one or more non-transitory computer-readable storage mediums, memory devices) can store data that can be obtained (e.g., generated, retrieved, received, accessed, written, manipulated, created, stored, etc.). In some implementations, the machine learning computing system can obtain data from one or more memories that are remote from the machine learning computing system. The memory can also store computer-readable instructions that can be executed by the one or more processors. The instructions can be software written in any suitable programming language or can be implemented in hardware. Additionally, or alternatively, the instructions can be executed in logically and/or virtually separate threads on processor(s). The memory can store the instructions that when executed by the one or more processors cause the one or more processors to perform operations. The machine learning computing system can include a communication interface, including devices and/or functions similar to that described with respect to the computing system.

Figure 6:
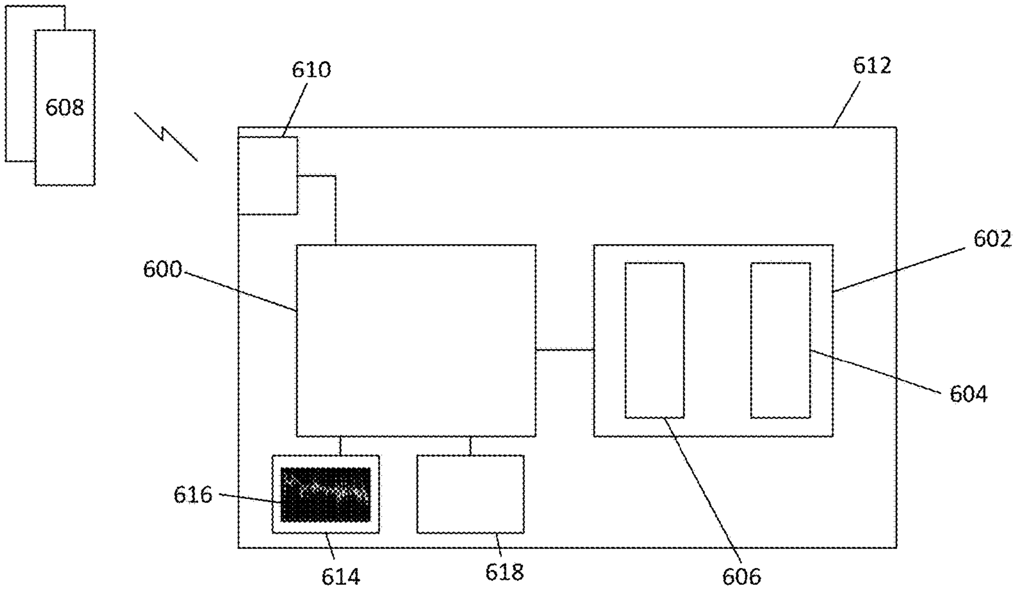
FIG. 6 is a schematic of a system for use in a distance to fault measurement and analysis in accordance with embodiments of the present disclosure.
Figure 7:
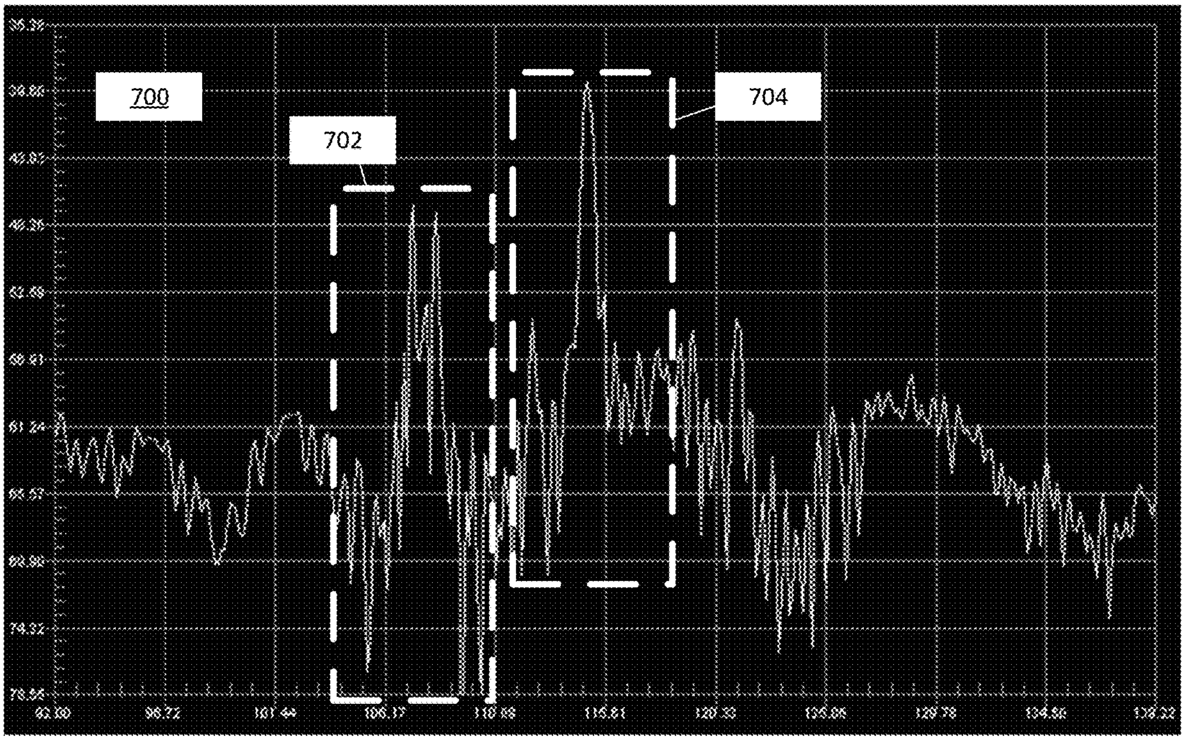
FIG. 7 is a chart of a distance to fault measurement as detected in a deployment in a telecommunication system in accordance with embodiments of the present disclosure.

In some implementations, the machine learning computing system can include one or more server computing devices 608 (FIG. 6). The one or more server computing devices 608 can communicate directly or indirectly with the processor(s) 600. For example, the one or more server computing devices 608 may communicate wirelessly with the processor(s) 600 through a communication circuitry 610 (such as a transceiver) coupled to the processor(s) 600. If the machine learning computing system includes multiple server computing devices, such server computing devices can operate according to various computing architectures, including, for example, sequential computing architectures, parallel computing architectures, or some combination thereof.

In addition, or alternatively to the model(s) at the machine learning computing system, the processor(s) 600 may be able to access data stored in memory 602 including one or more machine-learned models. As examples, the machine-learned models can be or can otherwise include various machine-learned models such as, for example, neural networks (e.g., deep neural networks), support vector machines, decision trees, ensemble models, k-nearest neighbors models, Bayesian networks, or other types of models including linear models and/or non-linear models. Example neural networks include feed-forward neural networks (e.g., convolutional neural networks), recurrent neural networks (e.g., long short-term memory recurrent neural networks, etc.), and/or other forms of neural networks.

In an embodiment, the machine learning computing system can communicate with the processor(s) 600 according to a client-server relationship. For example, the machine learning computing system can implement the machine-learned models to provide a web service to the processor(s) 600.

In some implementations, the machine learning computing system and/or the computing system can train the machine-learned models and/or through use of a model trainer. The model trainer can train the machine-learned models using one or more training or learning algorithms. One example training technique is backwards propagation of errors. In some implementations, the model trainer can perform supervised training techniques using a set of labeled training data. In other implementations, the model trainer can perform unsupervised training techniques using a set of unlabeled training data. The model trainer can perform a number of generalization techniques to improve the generalization capability of the models being trained. Generalization techniques include weight decays, dropouts, or other techniques.

The machine learning computing system can, through sufficient training technique, recognize aspects associated with elements of the system that allow for further analysis of the system as described herein.

In some instances, the RF signature for RF components may be different when measured in a lab as compared to when measured in the field (e.g., in situ). For example, localized noise and disturbances can affect the RF signature of an RF component. Proximity to certain materials and material densities can affect RF signatures of components. Moreover, some components may degrade as a result of time or exposure to one or more degrading sources, such as intense UV light, moisture, or the like. In some instances, the machine learning computing system can be configured to de-noise the measurements, thereby yielding a clean version of the signatures seen in the deployment. The machine learning computing system is trained on a wide variety of RF signatures with and without degradation, so is able to recognize such degradation and RF noise when it appears in a system in the field. This ability allows the machine learning computing system to reduce the noise in the measurements without affecting the accuracy or integrity of the measurements.

In some instances, the absolute strengths of the peaks might be different from calculated values based on the design of the system for various reasons. The machine learning computing system can be configured to learn relative peak values to detect all elements in the design. For example, the database 606 (FIG. 6) can include tested peak values of various components. By compiling peak values of the various components, the machine learning computing system may be able to generate comparisons between different elements. For example, referring again to FIG. 7, where the splitter has a peak value 702 of approximately 46.9 dB and the antenna has a peak value 704 of approximately 39.0 dB, a relative ratio of 46.9 dB:39.0 dB can be determined. Thus, the peak value 702 of the splitter is 1.2:1 in relation to the antenna. In instances where the measured peak value of the splitter is instead 44.7 dB and a nearby element is measured with a peak value of 37.25 dB, the machine learning value may be able to relatively identify the antenna as the nearby element, e.g., in view of the relative ratio between the elements. Yet other types of machine learning analysis may be performed to both identify elements and correct for noise and deviations measured within the system.

Referring again to FIG. 5, the method 500 can further include applying 512 a frequency sensitivity to the DTF measurement and testing protocol. The frequency sensitivity can correspond to each of the various system components. While wide-band measurements provide good resolution, RF components have differing return loss parameters in different frequency bands. In wide-band measurements, this translates to increased noise. Applying 512 the frequency sensitivity, the measurement may be segmented along these bands and the inverse Fourier transform can be computed. RF components that exhibit worse return loss in these regions respond with taller peaks in the DTF measurement. The machine learning computing system can use this information to resolve the components in a wide-band DTF measurement. Prior to use in the field (e.g., at the site of the deployment), the machine learning computing system may be trained to recognize regions of excessive return loss in wide-band DTF measurements after an IFT (Inverse Fourier Transform) has been applied. The narrow-band measurements (i.e. those made when frequency sensitivity is applied) may be used to assist in the training of the machine learning computing system.

The method 500 can further include applying 514 machine learning to perturb the design system with noise. In some implementations, the machine learning computing system can use measured information, such as the relative signal strengths of the various peaks, the position of the RF elements in the DTF (as determined, e.g., at one or more of steps 502 to 510), and the selective frequency responses. By combining and analyzing these measured information data points, the machine learning computing system can estimate a probability of failure. The machine learning computing system may be able to predict failure locations (e.g., with granularity down to less than 1 centimeter, or even less than 1 millimeter) with a high degree of confidence (e.g., a confidence score in excess of 95%, or even in excess of 99%, or even in excess of 99.9%). The method thus far has described a process of determination of the location of faults (mistmatch) in a system as it is found in the field at a certain point in time. However, many systems undergo degradation due to aging and environmental factors. In some cases, multiple measurements taken in a system over time (for example, over a series of several months) may reveal degradation of certain components. Adding noise to the RF tones can cause non-usual (i.e. unique) reflections from regions of faults, which an appropriately trained machine language computing system can use to locate the faults with high precision.

The method 500 can further include measuring 516 multiple return loss measurements and stitching the multiple return loss measurements together. The minimum resolvable distance to an element may be related to the bandwidth of the return loss measurement. However, the maximum resolvable distance is proportional to the frequency step in the return loss measurement. Given that the maximum number of points in a return loss measurement are fixed by the test equipment, there may arise a conflict. A technique of measuring 516 multiple return loss measurements along contiguous bands allows for stitching of different return loss measurements to analyze the system with greater accuracy. In some implementations, this can increase both minimum and maximum resolvable distances.

In some implementations, the method 500 can further include filtering 518 bad responses. There may be sections in the frequency band where some RF components exhibit poor response. This poor response might mask other real failures within the system by increasing the noise floor. This information may be determined in view of the datasheet and/or learned information stored in the database 606 (FIG. 6). Thus, filtering 518 can be performed to remove bad responses from specific frequency bands. The machine learning computing system can use information with and without masking to predict errors associated with the installation. For example, a system with multiple RF components, of which perhaps more than one is faulty, is typical of most real-world RF channels, where there are multiple RF cables, connectors, splitters, and other devices connected serially ("in a row"). If there is one component that is especially bad (i.e. it has a substantial DTF reflection signature) than that component can dominate and perhaps mask other faulty but not quite so bad components. In this case, an appropriately trained machine language computer system can be used to smooth out the DTF peak for the worst-offending component(s), thereby allowing other faulty parts, with less significant RF signature, to be located by revealing their RF signatures in more detail.

Referring again to FIG. 6, the methods and techniques described herein may be performed by a computing device 612. The computing device 612 can include one or more features as described above, such as the processor(s) 600, memory 602, instructions 604, the database 606, the communication circuitry 610, and the like. The computing device 612 can further include a user display 614 configured to display information 616 to the technician and a user implement 618 configured to receive input from a user. In some instances, the computing device 612 includes a single, discrete computing device (e.g., a laptop, a smartphone, an oscilloscope, etc.). In other instances, the computing device 612 can be split between two or more discrete computing systems. For example, the computing system may include a local user display 614 and a separate, discrete (remote) processor 600. The separate components can communicate with one another to affect user information to the technician. The computing device 612 can execute software, e.g., saved in memory 602, that provides functionality described herein.

Systems and methods described herein may reduce technical proficiency required to perform telecommunication system testing, and more particularly RF system testing. Information can be generated in a user-friendly manner while providing a system level RF health analysis. The system level RF health analysis should be understood to include the health of the entire deployment (or a large portion thereof) and not the RF health of individual components and elements within the deployment. In this regard, the technician can quickly diagnose problems at remote locations of the deployment and dispatch proper remedial care to address the problem. Without wishing to be to any particular theory, it is further believed that the amount of equipment required to perform the methods described herein is reduced as compared to traditional processes and techniques. Additionally, the reduced equipment requirements can open up room in the technician's vehicle for additional replacement/repair components and equipment to service and address downstream problems and technical issues. Yet other benefits will be appreciated after reading the entire scope of the disclosure.

Further aspects of the invention are provided by one or more of the following embodiments:

Embodiment 1. A method of determining system level RF health in an RF deployment, the method comprising: predicting an RF health of the deployment based on a known attribute of the deployment; receiving a distance to fault (DTF) measurement from the deployment, wherein receiving the DTF measurement comprises: transmitting a test signal into a cable associated with the RF deployment; and receiving a return signal from the cable, the return signal including a reflection; comparing the predicted RF health to the received DTF measurement; and identifying mismatches between the predicted RF health and the received DTF measurement based on the comparing.

Embodiment 2. The method of any one or more of the embodiments, wherein predicting the RF health of the deployment is performed in view of a known layout architecture of the deployment, a velocity of propagation within the cable, and/or a known RF signature associated with an RF component disposed within the deployment.

Embodiment 3. The method of any one or more of the embodiments, wherein receiving the DTF measurement further comprises analyzing information associated with a peak value contained in the received DTF measurement to determine a distance to a detected RF component disposed within the deployment.

Embodiment 4. The method of any one or more of the embodiments, wherein analyzing the information associated with a peak value contained in the received DTF measurement comprises comparing a peak value contained in the received DTF to a stored peak value associated with a known RF component to determine a make and model of the detected RF component.

Embodiment 5. The method of any one or more of the embodiments, wherein analyzing the information associated with the peak value is performed by a test equipment including a database having the stored peak value.

Embodiment 6. The method of any one or more of the embodiments, wherein analyzing the information associated with the peak value contained in the received DTF measurement is performed by a machine learning computing system using a machine-learned model.

Embodiment 7. The method of any one or more of the embodiments, further comprising applying frequency sensitivity to the received DTF measurement; applying machine learning to perturb the deployment with noise; measuring multiple return loss measurements and stitching together the multiple return loss measurements; and/or filtering one or more bad responses in the received DTF measurement.

Embodiment 8. The method of any one or more of the embodiments, wherein receiving the DTF measurement further comprises analyzing the return signal to determine a distance to the reflection from a location where the test signal is transmitted.

Embodiment 9. Test equipment configured to determine system level health in an RF deployment, the test equipment comprising: one or more processors; a memory in communication with the one or more processors, the memory storing computer-executable instructions which, when performed by the one or more processors, cause performance of a method, the method comprising: predicting an RF health of the RF deployment based on a known attribute of the RF deployment; receiving a distance to fault (DTF) measurement from the deployment, wherein receiving the DTF measurement comprises: transmitting a test signal into a cable associated with the RF deployment; and receiving a return signal from the cable, the return signal including a reflection; comparing the predicted RF health to the received DTF measurement; and identifying mismatches between the predicted RF health and the received DTF measurement based on the comparing.

Embodiment 10. The test equipment of any one or more of the embodiments, wherein predicting the RF health of the deployment is performed in view of a known layout architecture of the deployment, a velocity of propagation within the cable, and/or a known RF signature associated with an RF component disposed within the deployment.

Embodiment 11. The test equipment of any one or more of the embodiments, wherein receiving the DTF measurement further comprises analyzing information associated with a peak value contained in the received DTF measurement to determine a distance to a detected RF component disposed within the deployment.

Embodiment 12. The test equipment of any one or more of the embodiments, wherein analyzing the information associated with a peak value contained in the received DTF measurement comprises comparing a peak value contained in the received DTF to a stored peak value associated with a known RF component to determine a make and model of the detected RF component.

Embodiment 13. The test equipment of any one or more of the embodiments, wherein analyzing the information associated with the peak value is performed by a test equipment including a database having the stored peak value.

Embodiment 14. The test equipment of any one or more of the embodiments, wherein analyzing the information associated with the peak value contained in the received DTF measurement is performed by a machine learning computing system using a machine-learned model.

Embodiment 15. The test equipment of any one or more of the embodiments, further comprising applying frequency sensitivity to the received DTF measurement; applying machine learning to perturb the deployment with noise; measuring multiple return loss measurements and stitching together the multiple return loss measurements; and/or filtering one or more bad responses in the received DTF measurement.

Embodiment 16. The test equipment of any one or more of the embodiments, wherein receiving the DTF measurement further comprises analyzing the return signal to determine a distance to the reflection from a location where the test signal is transmitted.

Embodiment 17. A non-transitory computer readable medium having instructions which, when executed by a processor of a test equipment, cause the processor to perform operations including: predicting an RF health of the RF deployment based on a known attribute of the RF deployment; receiving a distance to fault (DTF) measurement from the deployment, wherein receiving the DTF measurement comprises: transmitting a test signal into a cable associated with the RF deployment; and receiving a return signal from the cable, the return signal including a reflection; comparing the predicted RF health to the received DTF measurement; and identifying mismatches between the predicted RF health and the received DTF measurement based on the comparing.

Embodiment 18. The non-transitory computer readable medium of any one or more of the embodiments, wherein predicting the RF health of the deployment is performed in view of a known layout architecture of the deployment, a velocity of propagation within the cable, and/or a known RF signature associated with an RF component disposed within the deployment.

Embodiment 19. The non-transitory computer readable medium of any one or more of the embodiments, wherein receiving the DTF measurement further comprises analyzing information associated with a peak value contained in the received DTF measurement to determine a distance to a detected RF component disposed within the deployment.

Embodiment 20. The non-transitory computer readable medium of any one or more of the embodiments, wherein analyzing the information associated with a peak value contained in the received DTF measurement comprises comparing a peak value contained in the received DTF to a stored peak value associated with a known RF component to determine a make and model of the detected RF component.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal language of the claims.

What is claimed is:

1. A method of determining system level RF health in an RF deployment, the method comprising:

predicting an RF health of the deployment based on a known attribute of the deployment;

receiving a distance to fault (DTF) measurement from the deployment, wherein receiving the DTF measurement comprises:

transmitting a test signal into a cable associated with the RF deployment; and receiving a return signal from the cable, the return signal including a reflection;

comparing the predicted RF health to the received DTF measurement; and identifying mismatches between the predicted RF health and the received DTF measurement based on the comparing.

2. The method of claim 1, wherein predicting the RF health of the deployment is performed in view of a known layout architecture of the deployment, a velocity of propagation within the cable, and/or a known RF signature associated with an RF component disposed within the deployment.

3. The method of claim 1, wherein receiving the DTF measurement further comprises analyzing information associated with a peak value contained in the received DTF measurement to determine a distance to a detected RF component disposed within the deployment.

4. The method of claim 3, wherein analyzing the information associated with a peak value contained in the received DTF measurement comprises comparing a peak value contained in the received DTF to a stored peak value associated with a known RF component to determine a make and model of the detected RF component.

5. The method of claim 4, wherein analyzing the information associated with the peak value is performed by a test equipment including a database having the stored peak value.

6. The method of claim 3, wherein analyzing the information associated with the peak value contained in the received DTF measurement is performed by a machine learning computing system using a machine-learned model.

7. The method of claim 1, further comprising applying frequency sensitivity to the received DTF measurement;

applying machine learning to perturb the deployment with noise;

measuring multiple return loss measurements and stitching together the multiple return loss measurements; and/or filtering one or more bad responses in the received DTF measurement.

8. The method of claim 1, wherein receiving the DTF measurement further comprises analyzing the return signal to determine a distance to the reflection from a location where the test signal is transmitted.

9. Test equipment configured to determine system level health in an RF deployment, the test equipment comprising:

one or more processors;

a memory in communication with the one or more processors, the memory storing computer-executable instructions which, when performed by the one or more processors, cause performance of a method, the method comprising:

predicting an RF health of the RF deployment based on a known attribute of the RF deployment;

receiving a distance to fault (DTF) measurement from the deployment, wherein receiving the DTF measurement comprises:

transmitting a test signal into a cable associated with the RF deployment; and receiving a return signal from the cable, the return signal including a reflection;

comparing the predicted RF health to the received DTF measurement; and identifying mismatches between the predicted RF health and the received DTF measurement based on the comparing.

10. The test equipment of claim 9, wherein predicting the RF health of the deployment is performed in view of a known layout architecture of the deployment, a velocity of propagation within the cable, and/or a known RF signature associated with an RF component disposed within the deployment.

11. The test equipment of claim 9, wherein receiving the DTF measurement further comprises analyzing information associated with a peak value contained in the received DTF measurement to determine a distance to a detected RF component disposed within the deployment.

12. The test equipment of claim 11, wherein analyzing the information associated with a peak value contained in the received DTF measurement comprises comparing a peak value contained in the received DTF to a stored peak value associated with a known RF component to determine a make and model of the detected RF component.

13. The test equipment of claim 12, wherein analyzing the information associated with the peak value is performed by a test equipment including a database having the stored peak value.

14. The test equipment of claim 11, wherein analyzing the information associated with the peak value contained in the received DTF measurement is performed by a machine learning computing system using a machine-learned model.

15. The test equipment of claim 9, further comprising applying frequency sensitivity to the received DTF measurement;

applying machine learning to perturb the deployment with noise;

measuring multiple return loss measurements and stitching together the multiple return loss measurements; and/or filtering one or more bad responses in the received DTF measurement.

16. The test equipment of claim 9, wherein receiving the DTF measurement further comprises analyzing the return signal to determine a distance to the reflection from a location where the test signal is transmitted.

17. A non-transitory computer readable medium having instructions which, when executed by a processor of a test equipment, cause the processor to perform operations including:

predicting an RF health of the RF deployment based on a known attribute of the RF deployment;

receiving a distance to fault (DTF) measurement from the deployment, wherein receiving the DTF measurement comprises:

transmitting a test signal into a cable associated with the RF deployment; and receiving a return signal from the cable, the return signal including a reflection;

comparing the predicted RF health to the received DTF measurement; and identifying mismatches between the predicted RF health and the received DTF measurement based on the comparing.

18. The non-transitory computer readable medium of claim 17, wherein predicting the RF health of the deployment is performed in view of a known layout architecture of the deployment, a velocity of propagation within the cable, and/or a known RF signature associated with an RF component disposed within the deployment.

19. The non-transitory computer readable medium of claim 17, wherein receiving the DTF measurement further comprises analyzing information associated with a peak value contained in the received DTF measurement to determine a distance to a detected RF component disposed within the deployment.

20. The non-transitory computer readable medium of claim 19, wherein analyzing the information associated with a peak value contained in the received DTF measurement comprises comparing a peak value contained in the received DTF to a stored peak value associated with a known RF component to determine a make and model of the detected RF component.

* * * * *